US012745685B2

(12) United States Patent
Park et al.

(10) Patent No.: US 12,745,685 B2
(45) Date of Patent: Sep. 22, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Kitae Park, Suwon-si (KR); Seungmin Baek, Suwon-si (KR); Joohyung Lee, Suwon-si (KR); Junghyun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 514 days.

(21) Appl. No.: 18/223,757

(22) Filed: Jul. 19, 2023

(65) Prior Publication Data

US 2024/0162130 A1 May 16, 2024

(30) Foreign Application Priority Data

Nov. 16, 2022 (KR) ........................ 10-2022-0153575

(51) Int. Cl.
*H10W 90/00* (2026.01)
*H10W 70/05* (2026.01)
*H10W 70/63* (2026.01)

(52) U.S. Cl.
CPC ....... *H10W 90/701* (2026.01); *H10W 70/093* (2026.01); *H10W 70/095* (2026.01); *H10W 70/635* (2026.01)

(58) Field of Classification Search
CPC ............. H10W 90/701; H10W 70/093; H10W 70/095; H10W 70/635; H10W 90/20-401; H10W 40/253
See application file for complete search history.

(56) References Cited

U.S. PATENT DOCUMENTS 8,895,358 B2 11/2014 Lin
9,299,660 B2 3/2016 Teh et al.
(Continued)

FOREIGN PATENT DOCUMENTS

KR 101612764 B1 4/2016

*Primary Examiner* — Evan G Clinton
(74) *Attorney, Agent, or Firm* — Muir Patent Law, PLLC

(57) ABSTRACT

A semiconductor package includes a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface, a second redistribution wiring layer disposed on the first surface of the first redistribution wiring layer, the second redistribution wiring layer including an insulating layer, a logic semiconductor chip provided in the insulating layer, second redistribution wires electrically connected to the logic semiconductor chip, and third redistribution wires electrically connected to the first redistribution wires, the third redistribution wires extending to penetrate the insulating layer, a third redistribution wiring layer disposed on the second redistribution wiring layer, the third redistribution wiring layer including fourth redistribution wires electrically connected to the third redistribution wires, and a semiconductor substrate disposed on an upper surface of the third redistribution wire layer, the semiconductor substrate including at least one memory semiconductor chip electrically connected to the fourth redistribution wires.

20 Claims, 15 Drawing Sheets

(56) References Cited

U.S. PATENT DOCUMENTS

| | | | |
|---|---|---|---|
| 9,768,145 B2 | 9/2017 | Yu et al. | |
| 10,867,954 B2 | 12/2020 | Ting et al. | |
| 10,998,290 B2 | 5/2021 | Watanabe et al. | |
| 11,367,705 B2 | 6/2022 | Beyne | |
| 11,393,805 B2 | 7/2022 | Yu et al. | |
| 2021/0066279 A1* | 3/2021 | Yu | H01L 23/367 |
| 2023/0260865 A1* | 8/2023 | Kim | H01L 23/36 257/717 |

* cited by examiner

10

W
204
200
202
310a
310b
300
400
C2
304
302
SR
CR
SR
500
600
600
510
240
230
610
220
224
222
210
330
320
414
410
412
420

W
100
110a
110b
110c
110d
204
200
202
300
310a
310b
400
C2
302
304
102
104
500
600
600
510
230
240
610
130
120a
120b
220
224
222
210
330
320
414
410
412
420

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0153575, filed on Nov. 16, 2022, in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a plurality of stacked different semiconductor chips and a method of manufacturing the same.

2. Description of the Related Art

In package-on-package technology, a plurality of semiconductor packages may be vertically stacked and electrically connected to each other through conductive bumps. In case of using the conductive bumps, a thickness of a semiconductor device may increase. An embedded trace substrate may be required to electrically connect the conductive bumps and a redistribution wiring layer. In this case, manufacturing processes may be added to form the conductive bumps, high-density circuit boards, etc. An intermetallic compound may increase due to the conductive bump, and reliability may decrease. Further, as the thickness of the semiconductor device increases, heat dissipation characteristics may be deteriorated.

SUMMARY

Example embodiments provide a semiconductor package including a structure capable of reducing manufacturing processes and having improved heat dissipation characteristics and reliability.

Example embodiments provide a method of manufacturing the semiconductor package.

According to example embodiments, a semiconductor package includes a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface, a second redistribution wiring layer disposed on the first surface of the first redistribution wiring layer, the second redistribution wiring layer including an insulating layer, a logic semiconductor chip provided in the insulating layer, second redistribution wires electrically connected to the logic semiconductor chip, and third redistribution wires electrically connected to the first redistribution wires, the third redistribution wires extending to penetrate the insulating layer, a third redistribution wiring layer disposed on the second redistribution wiring layer, the third redistribution wiring layer including fourth redistribution wires electrically connected to the third redistribution wires, and a semiconductor substrate disposed on an upper surface of the third redistribution wire layer, the semiconductor substrate including at least one memory semiconductor chip electrically connected to the fourth redistribution wires.

According to example embodiments, in a method of manufacturing a semiconductor package, at least one cavity vertically penetrating at least a portion of a semiconductor substrate is formed. The semiconductor substrate having upper and lower surfaces opposed to each other. A memory semiconductor chip is arranged in the cavity such that second chip pads face the lower surface. A third redistribution wiring layer is formed on the lower surface of the semiconductor substrate, the third redistribution wiring layer having fourth redistribution wires that are electrically connected to the second chip pads, a logic semiconductor chip on the third redistribution wiring layer such that a rear surface of the logic semiconductor chip faces the third redistribution wiring layer. A second redistribution wiring layer is formed on the third redistribution wiring layer, the second redistribution wiring layer having second redistribution wires and third redistribution wires, the third redistribution wires electrically connected to the fourth redistribution wires, the second redistribution wires electrically connected to first chip pads that are exposed from a front surface of the logic semiconductor chip. A first redistribution wiring layer having first redistribution wires and landing pads is formed on the second redistribution wiring layer, the first redistribution wires electrically connected to the second and third redistribution wires, the landing pads electrically connected to the first redistribution wires and exposed from a bottom surface.

According to example embodiments, a semiconductor package includes a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface, a second redistribution wiring layer disposed on the first surface of the first redistribution wiring layer; the second redistribution wiring layer including an insulating layer, a logic semiconductor chip provided in the insulating layer, second redistribution wires electrically connected to the logic semiconductor chip and the first redistribution wires, and third redistribution wires electrically connected to the first redistribution wires and extending to penetrate the insulating layer, a third redistribution wiring layer disposed on the second redistribution wiring layer, the third redistribution wiring layer having fourth redistribution wires that are electrically connected to the third redistribution wires, a chip mounting film adhering the third redistribution wiring layer and an upper surface of the logic semiconductor chip, and a semiconductor substrate disposed on an upper surface of the third redistribution wiring layer, the semiconductor substrate including at least one memory semiconductor chip electrically connected to the fourth redistribution wires, a cavity in which the memory semiconductor chip is accommodated therein, a molding member provided between the cavity and the memory semiconductor chip.

According to example embodiments, a semiconductor package may include a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface, a second redistribution wiring layer disposed on the first surface of the first redistribution wiring layer, the second redistribution wiring layer including an insulating layer, a logic semiconductor chip provided in the insulating layer, second redistribution wires electrically connected to the logic semiconductor chip, and third redistribution wires electrically connected to the first redistribution wires, the third redistribution wires extending to penetrate the insulating layer, a third redistribution wiring layer disposed on the second redistribution wiring layer, the third redistribution wiring layer including fourth redistribution wires electrically connected to the third redistribution wires, and a semiconductor substrate disposed on an upper surface of the third redistribution wire layer, the semiconductor substrate including at least one memory semiconductor chip electrically connected to the fourth redistribution wires.

Thus, the memory semiconductor chip may be electrically connected to the logic semiconductor chip through the second and third redistribution wiring layers. Since no conductive bump is provided between the memory semiconductor chip and the third redistribution wiring layer, a process may be simplified by excluding process steps that are performed to form the conductive bumps. Since conductive connection wiring (Au wiring), semiconductor substrate (PCB), etc. required to electrically connecting the memory semiconductor chip and the logic semiconductor chip are not used, process costs may be reduced. During the process, the number of times a carrier substrate is used may be reduced. An unnecessary process such as a laser ablation process may be excluded.

Also, since the conductive bumps are not provided, a thickness of the semiconductor package may be reduced. When the thickness of the semiconductor package is reduced, heat dissipation characteristics may be improved. Since a high-density circuit board (embedded trace substrate) for electrically connecting the conductive bumps is not used, a package structure may be simplified. Reliability of the semiconductor package may be improved by reducing an intermetallic compound that is generated by the conductive bump.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIGS. 2 to 15 are cross-sectional views illustrating a method of manufacturing the semiconductor package in FIG. 1 in accordance with example embodiments.

DETAILED DESCRIPTION OF EXAMPLE EMBODIMENTS

Hereinafter, example embodiments will be explained in detail with reference to the accompanying drawings. Like numerals refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Figure 1:
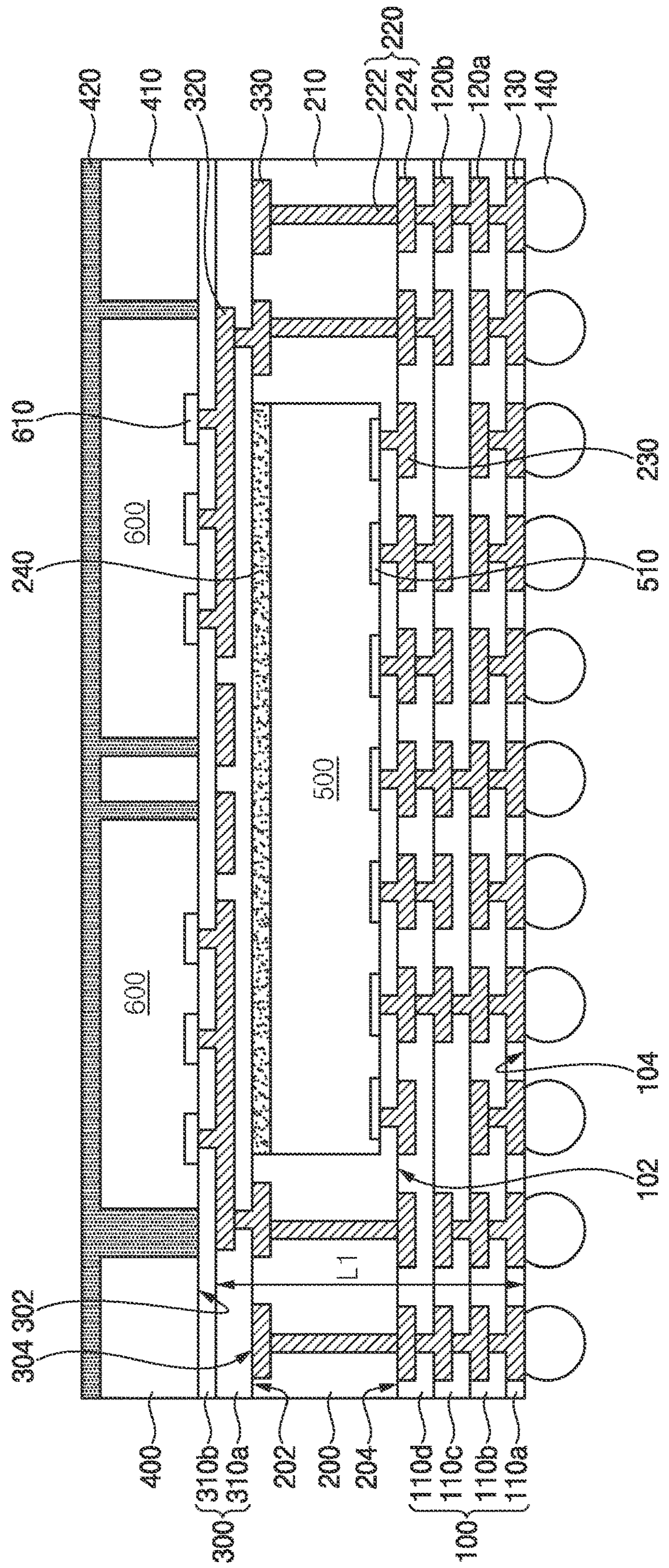
FIG. 1 to 15 represent non-limiting, example embodiments as described herein.

FIG. 1 is a cross-sectional view illustrating a semiconductor package in accordance with example embodiments.

Referring to FIG. 1, a semiconductor package 10 may include a first redistribution wiring layer 100, a second redistribution wiring layer 200 provided on the first redistribution wiring layer 100 and having a logic semiconductor chip 500, a third redistribution wiring layer 300 provided on the second redistribution wiring layer, and a semiconductor substrate 400 provided on the third redistribution wiring layer 300 and having at least one memory semiconductor chip 600.

In example embodiments, the semiconductor package 10 may be referred to as a memory module having a stacked chip structure in which a plurality of dies (chips) are stacked. For example, the logic semiconductor chip may include an application specific integrated circuit (ASIC) serving as a host such as a central processing unit (CPU), graphics processing unit (GPU), or system on a chip (SoC). The memory semiconductor chip may include a high bandwidth memory (HBM) device, a dynamic random access memory (DRAM), and the like.

In example embodiments, the first redistribution wiring layer 100 may include a plurality of redistribution wires 120*a* and 120*b*. The first redistribution wiring layer 100 may include a first surface 102 and a second surface 104 opposite to each other. The first redistribution wiring layer 100 may include a plurality of landing pads 130 provided to be exposed from a lower surface, that is, the second surface 104 of the first redistribution wiring layer 100.

In example embodiments, the first redistribution wiring layer 100 may include a plurality of insulating layers 110*a*, 110*b*, 110*c*, and 110*d*, and the redistribution wires 120*a* and 120*b* may be arranged in the insulating layers 110*a*, 110*b*, 110*c*, and 110*d*. The insulating layers 110*a*, 110*b*, 110*c*, and 110*d* may be formed of a polymer or a dielectric layer. The insulating layers 110*a*, 110*b*, 110*c*, and 110*d* may be formed by a vapor deposition process, a spin coating process, or the like. The redistribution wires 120*a* and 120*b* may be formed by a plating process, an electroless plating process, a vapor deposition process, or the like. The redistribution wires 120*a* and 120*b* may be electrically connected to the landing pads 130.

In example embodiments, the insulating layers 110 may cover the redistribution wires 120. The first insulating layer (lowermost insulating layer) 110*a* may be provided on the second surface 104 of the first redistribution wiring layer 100, and the fourth insulating layer (uppermost insulating layer) 110*d* may be provided on the first surface 102 of the first redistribution wiring layer 100.

Particularly, the plurality of landing pads 130 may be provided in the first insulating layer 110*a*. Lower surfaces of the landing pads 130 may be exposed from the lower surface of the first insulating layer 110*a*, that is, the second surface 104. The first insulating layer 110*a* may have first openings that expose the lower surfaces of the landing pads 130, respectively.

The first redistribution wires 120*a* may be provided in the second insulating layer 110*b*. The second insulating layer 110*b* may be provided on the first insulating layer 110*a*, and may have second openings that expose the first redistribution wires 120*a*. The first redistribution wires 120*a* may be provided on the landing pads 130. The first redistribution wires 120*a* may contact the landing pads 130 through the second openings.

The third redistribution wires 120*b* may be provided in the third insulating layer 110*c*. The third insulating layer 110*c* may be provided on the second insulating layer 110*b*, and may have third openings that expose the third redistribution wires 120*b*. The third redistribution wires 120*b* may be provided on the first redistribution wires 120*a*. The third redistribution wires 120*b* may contact the first redistribution wires 120*a* through the third openings.

The fourth insulating layer 110*d* may be provided on the third insulating layer 110*c*, and may have fourth openings that expose the third redistribution wires 120*b*. The third redistribution wires 120*b* may contact second redistribution wires 230 or fourth redistribution wires 220 of the second redistribution wiring layer 200 through the fourth openings.

The landing pad 130 and the first and third redistribution wires 120*a* and 120*b* may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, the first redistribution wiring layer 100 may be connected to other semiconductor devices through external connection bumps 140 as conductive connection members. Each of the external connection bumps 140 may be provided on a corresponding one of the landing pads 130. For example, the external connection bump 140 may include a C4 bump. The landing pad 130 of the first redistribution wiring layer 100 may be electrically connected to a substrate pad of a package substrate through the external connection bump 140.

In example embodiments, the second redistribution wiring layer 200 may be provided on the first surface 102 of the first redistribution wiring layer 100. The second redistribution wiring layer 200 may have a third surface 202 and a fourth surface 204 opposite to each other. The second redistribution wiring layer 200 may be provided such that the fourth surface 204 is bonded to the first surface 102 of the first redistribution wiring layer 100.

The second redistribution wiring layer 200 may include a fifth insulating layer 210 and a plurality of redistribution wires 220 provided in the fifth insulating layer 210. The second redistribution wiring layer 200 may include a plurality of second redistribution wires 230 provided to be exposed from a lower surface, that is, the fourth surface 204 of the second redistribution wiring layer 200. The fourth redistribution wires 220 and the second redistribution wires 230 may be electrically connected to the third redistribution wires 120*b* of the first redistribution wiring layer 100.

In example embodiments, the fifth insulating layer 210 may cover at least a portion of the fourth redistribution wires 220 and at least a portion of the second redistribution wires 230. The logic semiconductor chip 500 may be provided in the fifth insulating layer 210. The fifth insulating layer 210 may cover an outer surface of the logic semiconductor chip 500. A third redistribution wiring layer 300 may be arranged on an upper surface of the fifth insulating layer 210. The fifth insulating layer 210 may have a parallel upper surface on which the third redistribution wiring layer 300 is arranged.

Particularly, each of the second redistribution wires 230 and the fourth redistribution wires 220 may be exposed from a lower surface of the fifth insulating layer 210, that is, the fourth surface 204. The fifth insulating layer 210 may have fifth openings that are capable of electrically connecting the second redistribution wires 230 and the fourth redistribution wires 220 to the third redistribution wires 120*b*.

In example embodiments, each of the fourth redistribution wires 220 may include a redistribution line 224 electrically connected to at least a portion of the third redistribution wires 120*b*, and a redistribution via 222 provided on the redistribution line 224. The redistribution via 222 may penetrate at least a portion of the fifth insulating layer 210, and the redistribution via 222 may be electrically connected to at least a portion of the fifth redistribution wires 320 of the third redistribution wiring layer 300.

The redistribution vias 222 may penetrate through the fifth insulating layer 210 in a vertical direction. The redistribution vias 222 may be electrically connected to the third redistribution wire 120*b* of the first redistribution wiring layer 100 through the redistribution line 224. The redistribution vias 222 may be provided outside the logic semiconductor chip 500 that is provided in the fifth insulating layer 210. For example, the redistribution vias 222 may be spaced apart from the logic semiconductor chip 500. The redistribution vias 222 may extend from the redistribution line 224 in the same vertical direction as a thickness direction of the second redistribution wiring layer 200.

Particularly, the redistribution vias 222 may be electrically connected to the third redistribution wire 120*b* of the first redistribution wiring layer 100. The redistribution vias 222 may be electrically connected to redistribution pad 330 of the third redistribution wiring layer 300. The redistribution vias 222 may provide a signal transfer path that is capable of electrically connecting the first redistribution wiring layer 100 and the third redistribution wiring layer 300.

The second redistribution wire 230 and the fourth redistribution wire 220 may include the metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, the second redistribution wiring layer 200 may include the logic semiconductor chip 500 that is provided in the fifth insulating layer 210. The logic semiconductor chip 500 may include first chip pads 510 that are exposed from a front surface. The first chip pads 510 of the logic semiconductor chip 500 may be electrically connected to the third redistribution wires 120*b* of the first redistribution wiring layer 100.

For example, the logic semiconductor chip may include a central processing unit (CPU), a graphics processing unit (GPU), a micro processing unit (MPU), a micro controller (MCU, Microcontroller Unit), and an application processor (AP).

In example embodiments, the semiconductor package 10 may further include a chip mounting film 240 that is provided between the third redistribution wiring layer 300 and an upper surface of the logic semiconductor chip 500. The chip mounting film 240 may be a die attach film (DAF). The chip mounting film 240 may attach the upper surface of the logic semiconductor chip 500 to the third redistribution wiring layer 300.

In example embodiments, the third redistribution wiring layer 300 may have a fifth surface 302 and a sixth surface 304 opposite to each other. The third redistribution wiring layer 300 may include a plurality of the redistribution pads 330 that are exposed from the sixth surface 304. The third redistribution wiring layer 300 may be arranged on the third surface 202 of the second redistribution wiring layer 200. The semiconductor substrate 400 may be arranged on the third redistribution wiring layer 300.

The second surface 104 of the first redistribution wiring layer 100 may be provided to be spaced apart from the fifth surface 302 of the third redistribution wiring layer 300 by a first distance L1. For example, the first distance L1 may be within a range of 0.85 mm to 1 mm.

The third redistribution wiring layer 300 may be electrically connected to the first redistribution wiring layer 100 through the fourth redistribution wires 220 that are electrically connected to the redistribution pads 330. The fourth redistribution wires 220 that penetrate at least a portion of the fifth insulating layer 210 may electrically connect the first redistribution wiring layer 100 and the third redistribution wiring layer 300.

In example embodiments, the third redistribution wiring layer 300 may include sixth and seventh insulating layers 310*a* and 310*b*, and fifth redistribution wires 320 may be provided in the sixth and seventh insulating layers 310*a* and 310*b*. The fifth redistribution wires 320 may be electrically connected to the redistribution pads 330.

Particularly, the plurality of fifth redistribution wires 320 may be provided in the seventh insulating layer 310*b*. One side of the fifth redistribution wire 320 may be exposed from an upper surface, that is, the fifth surface 302 of the seventh insulating layer 310*b*. The seventh insulating layer 310*b* may have a seventh opening that exposes the one side of the fifth redistribution wire 320.

The plurality of redistribution pads 330 may be provided on the sixth insulating layer 310*a*. A lower surface of each of the redistribution pads 330 may be exposed from a lower surface of the sixth insulating layer 310*a*, that is, the fifth surface 304. The sixth insulating layer 310*a* may have sixth openings to electrically connect the redistribution pads 330 to the fifth redistribution wires 320.

The redistribution pads 330 and the fifth redistribution wires 320 may include the metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, the semiconductor substrate 400 may be provided on the fifth surface 302 of the third redistribution wiring layer 300. The semiconductor substrate 400 may include a silicon substrate 410 having at least one cavity, at least one of the memory semiconductor chip 600 provided in the cavity, and a molding member 420 covering an inner surface of the cavity and an outer surface of the memory semiconductor chip 600.

For example, the silicon substrate 410 may include a semiconductor material such as silicon, germanium, or silicon-germanium. The silicon substrate 410 may be formed of a III-V compound semiconductor such as gallium phosphide (GaP), gallium arsenide (GaAs), or gallium antimonide (GaSb). In example embodiments, the silicon substrate 410 may include a silicon-on-insulator (SOI) substrate or a germanium-on-insulator (GOD substrate.

The memory semiconductor chip 600 may be provided to face the third redistribution wiring layer 300. The memory semiconductor chip 600 may include second chip pads 610 that are exposed from a front surface. The second chip pads 610 of the memory semiconductor chip 600 may be electrically connected to the fifth redistribution wires 320 of the third redistribution wiring layer 300.

For example, the memory semiconductor chip may include SRAM, DRAM, flash memory, PRAM, MRAM, and RRAM.

Hereinafter, a method of manufacturing the semiconductor package in FIG. 1 will be described.

Figure 2:
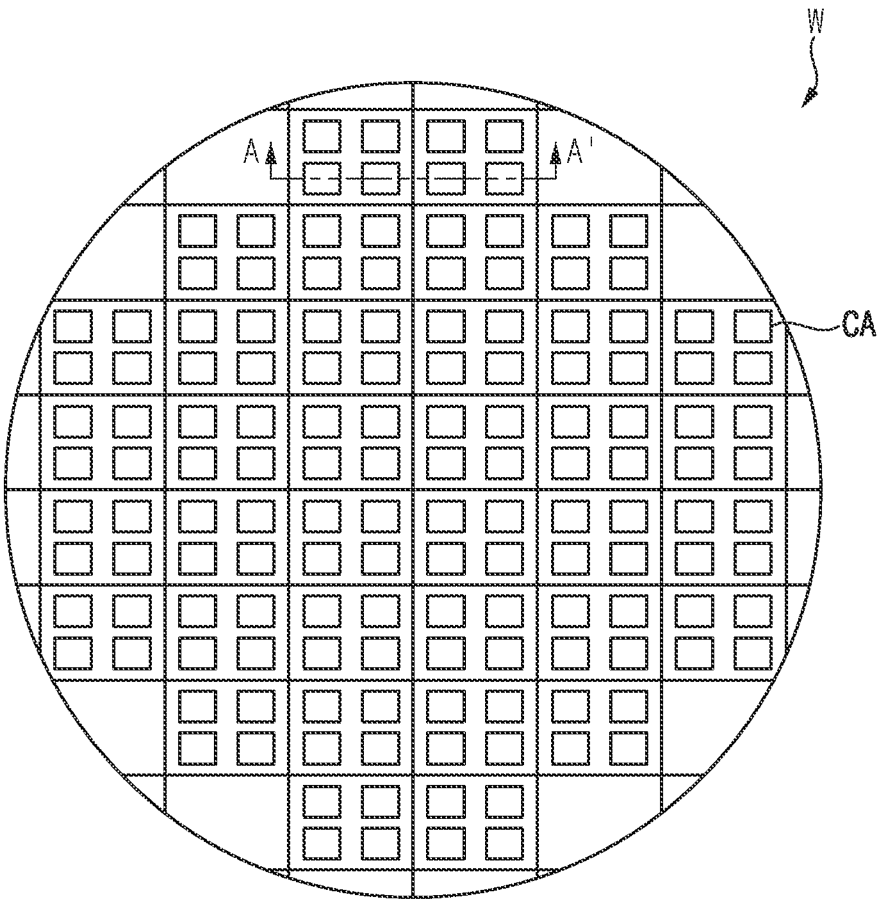
Figure 3:
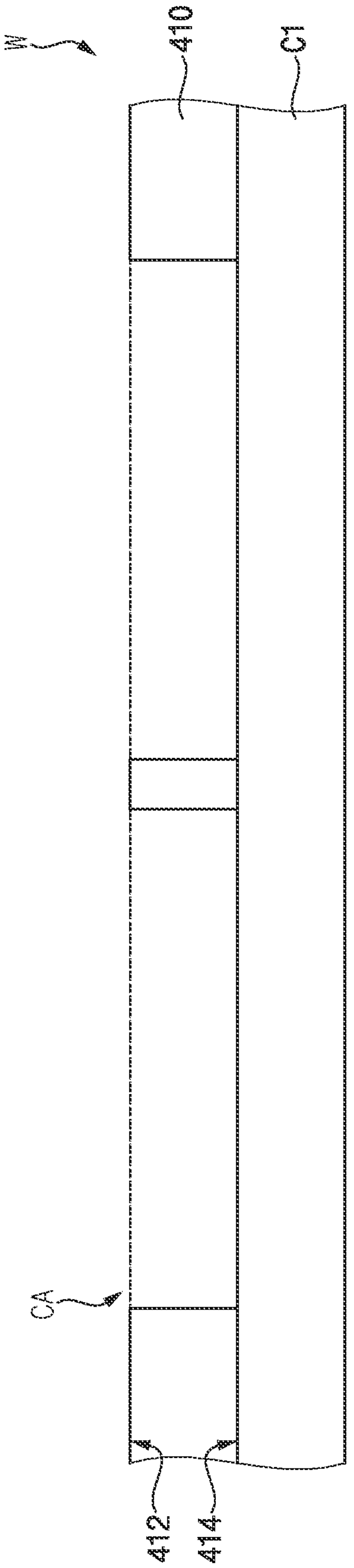
Figure 4:
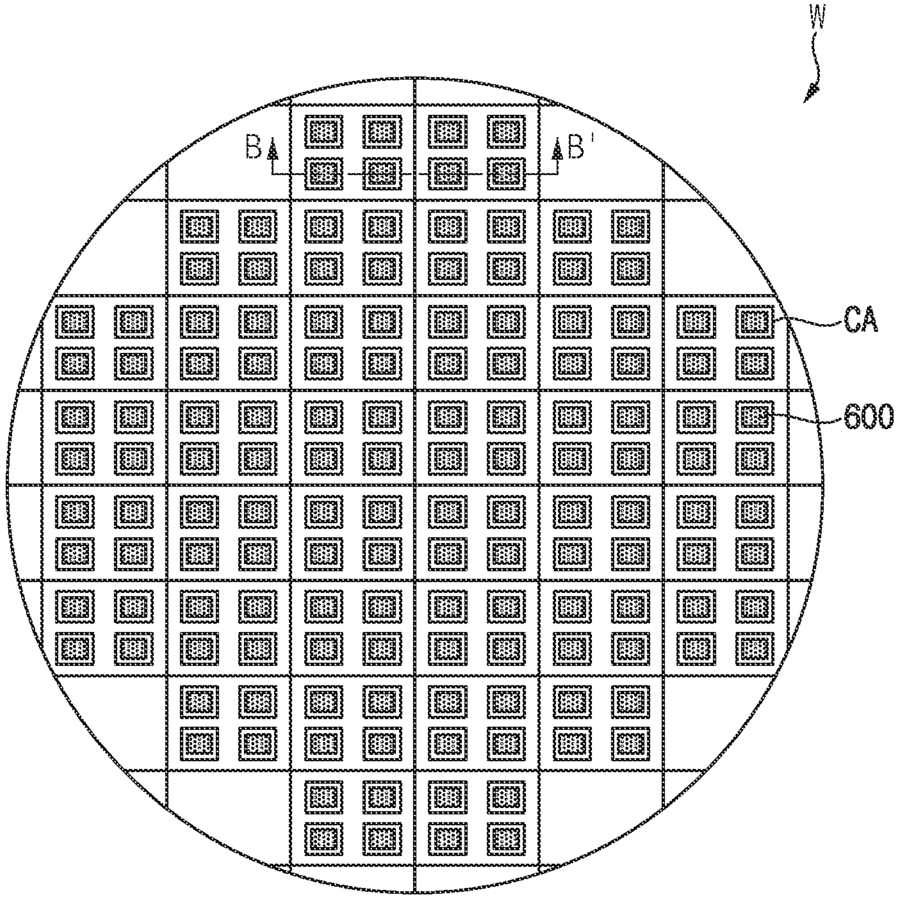
Figure 5:
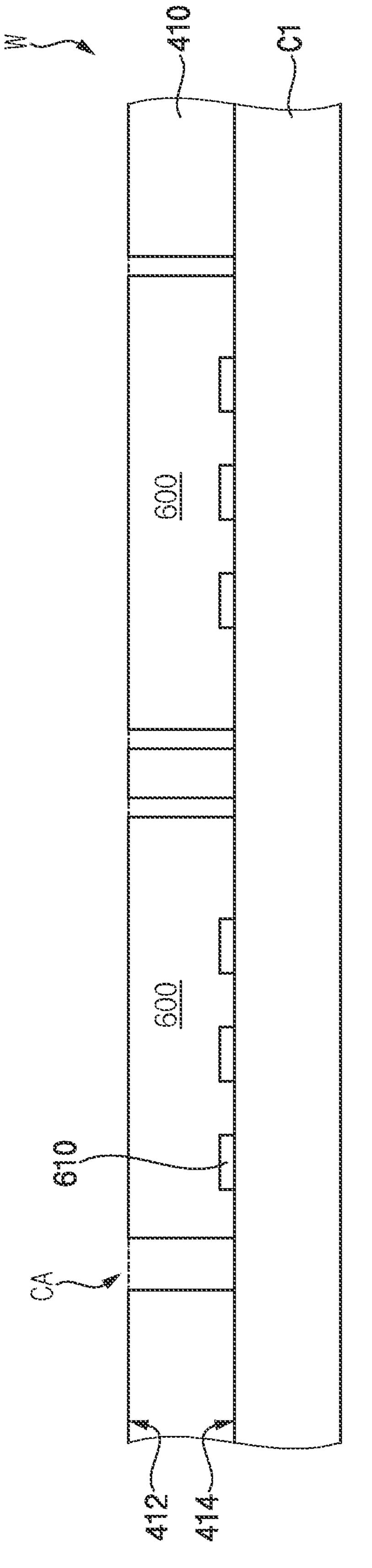

FIGS. 2 to 15 are cross-sectional views illustrating a method of manufacturing the semiconductor package in FIG. 1 in accordance with example embodiments. FIG. 2 is a plan view illustrating a semiconductor wafer. FIG. 3 is a cross-sectional view taken along the line A-A' in FIG. 2. FIG. 4 is a plan view illustrating a semiconductor wafer on which memory semiconductor chips are mounted. FIG. 5 is a cross-sectional view taken along the line B-B' in FIG. 4.

Referring to FIGS. 2 to 5, first, a semiconductor wafer W having a silicon substrate 410 may be provided on a first carrier substrate C1. A plurality of cavities CA may be formed on the silicon substrate 410 of the semiconductor wafer W, and memory semiconductor chips 600 may be arranged within the cavities CA.

In example embodiments, the silicon substrate 410 may have an upper surface 412 and a lower surface 414 opposite to each other. The lower surface 414 of the silicon substrate 410 may face the first carrier substrate C1.

For example, the silicon substrate 410 may be formed of a semiconductor material such as silicon, germanium, or silicon-germanium. The silicon substrate 410 may include a III-V compound semiconductor such as gallium phosphide (GaP), gallium arsenide (GaAs), or gallium antimonide (GaSb). In example embodiments, the silicon substrate 410 may include a silicon-on-insulator (SOI) substrate or a germanium-on-insulator (GOI) substrate.

Then, a first photoresist layer may be formed on the silicon substrate 410, and an exposure process may be performed on the first photoresist layer to form a first photoresist pattern that exposes regions of the cavities CA.

As illustrated in FIG. 3, the silicon substrate 410 may be selectively removed to form the cavities CA. An etching process may be performed on the first photoresist pattern of the silicon substrate 410 to form the cavities CA. The cavities CA may be formed to penetrate through the silicon substrate 410 from the upper surface 412 to the lower surface 414. For example, the etching process may include a wet etching process, a dry etching process, a plasma etching process, and the like.

The wet etching process may be performed using an etchant that has an etching selectivity with respect to the silicon substrate. For example, the etchant may include water ($H_2O$), hydrogen peroxide ($H_2O_2$), citric acid ($C_6H_8O_7$), and the like. The dry etching process may include a physical etching process, a chemical etching process, and a physical chemical etching process. The plasma etching process may be performed using inductively coupled plasma, capacitively coupled plasma, microwave plasma, or the like.

As illustrated in FIG. 5, the memory semiconductor chips 600 may be respectively accommodated within the cavities CA. The memory semiconductor chips 600 may be arranged on the first carrier substrate C1. An outer surface of the memory semiconductor chips 600 may be spaced apart from an inner surface of the cavities CA. Second chip pads 610 of the memory semiconductor chip 600 may be arranged to face the lower surface 414 of the silicon substrate 410.

Figure 6:
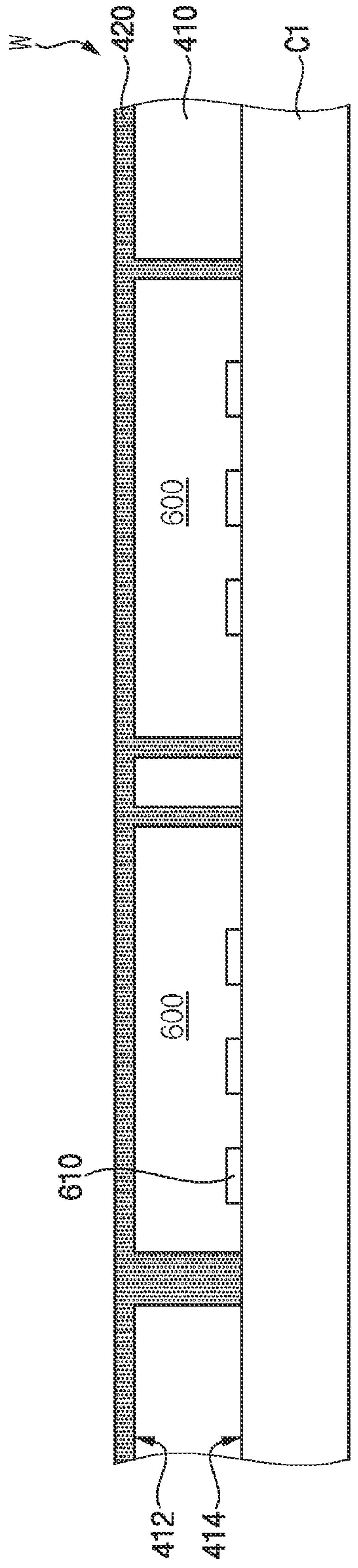

Referring to FIG. 6, a molding member 420 may be formed to cover the memory semiconductor chip 600 within the cavity CA of the silicon substrate 410. The molding member 420 may be formed on the inner surface of the cavity CA and the outer surface of the memory semiconductor chip 600.

For example, the molding member 420 may be formed of an epoxy molding compound (EMC). The molding member 420 may include UV resin, polyurethane resin, silicone resin, or silica filler.

Figure 7:
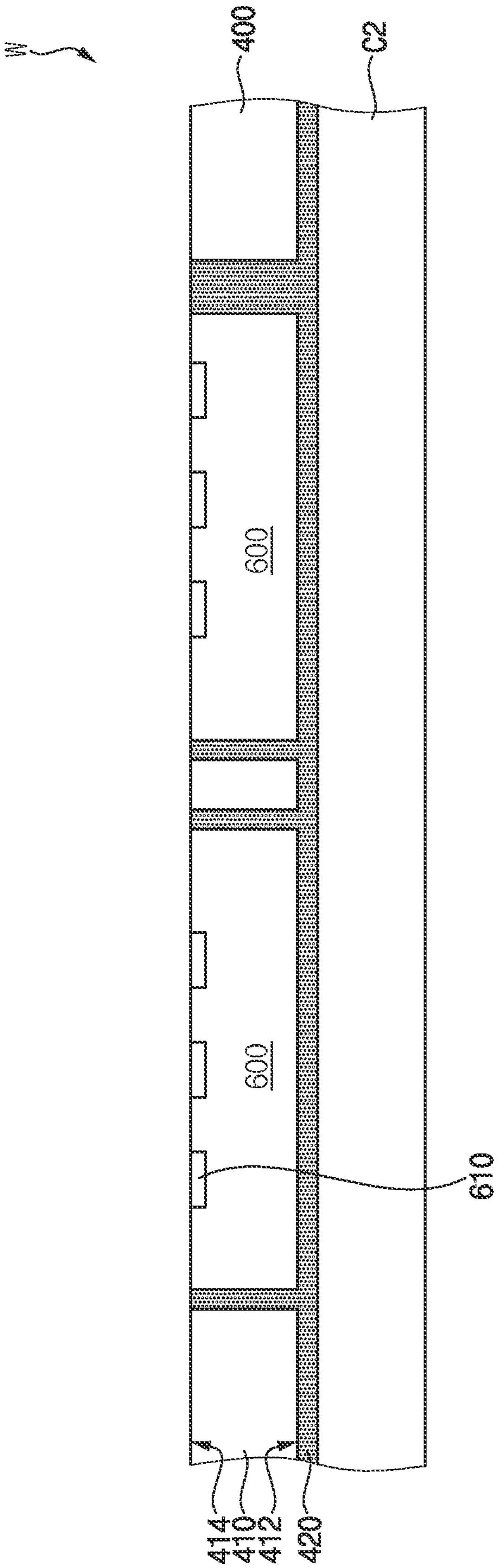
Figure 8:
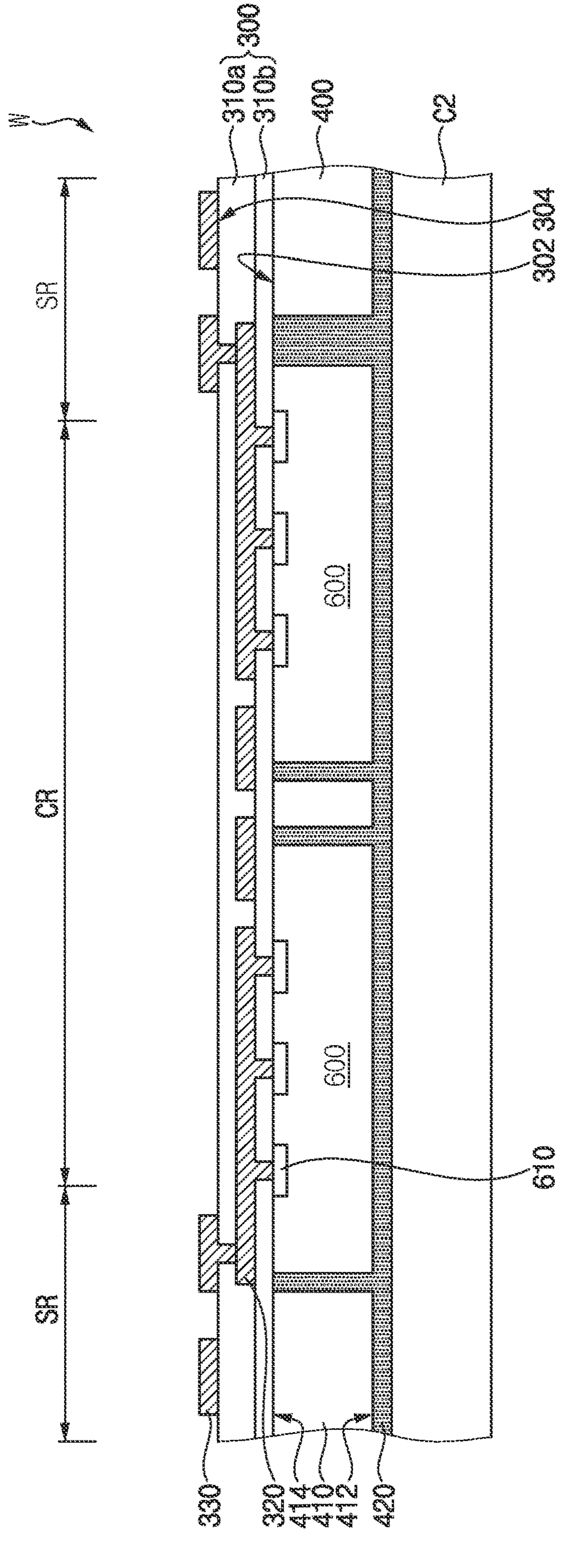

Referring to FIGS. 7 and 8, a third redistribution wiring layer 300 may be formed on the semiconductor substrate 400. The third redistribution wiring layer 300 may be formed such that the second chip pads 610 of the memory semiconductor chip 600 are electrically connected to the fifth redistribution wires 320. The third redistribution wiring layer 300 may have a fifth surface 302 and a sixth surface 304 opposite to each other. The third redistribution wiring layer 300 may have a chip mounting region CR, and a peripheral region SR surrounding the chip mounting region CR.

As illustrated in FIG. 7, after a second carrier substrate C2 is attached to the molding member 420 of the semiconductor substrate 400, a structure to which the second carrier substrate C2 is attached may be turned over, and the first carrier substrate C1 on the lower surface 414 of the silicon substrate 410 may be removed. In this case, the second chip pads 610 of the memory semiconductor chips 600 may be exposed from the lower surface 414 of the silicon substrate 410.

Then, referring to FIG. 8, after a seventh insulating layer 310*b* is formed on the semiconductor substrate 400 to cover the second chip pads 610 of the memory semiconductor chip 600, the seventh insulating layer 310*b* may be patterned to form seventh openings that expose the second chip pads 610.

For example, the seventh insulating layer 310*b* may include a polymer or a dielectric layer. Particularly, the seventh insulating layer 310*b* may include polyimide (PI), lead oxide (PbO), polyhydroxystyrene (PHS), or NOVOLAC. The seventh insulating layer 310*b* may be formed by a vapor deposition process, a spin coating process, or the like.

A fifth redistribution wire 320 directly contacting each of the second chip pads 610 through the seventh openings may be formed on the seventh insulating layer 310*b*. After a seed layer is formed on a portion of the seventh insulating layer 310*b* and into the seventh opening, the seed layer may be patterned and an electroplating process may be performed to form the fifth redistribution wire 320. Thus, at least a portion of the fifth redistribution wire 320 may directly contact each of the second chip pads 610 through the seventh opening.

For example, the fifth redistribution wire 320 may include aluminum (Al), copper (Cu), tin (Sn), nickel (Ni), gold (Au), platinum (Pt), or an alloy thereof.

Then, after a sixth insulating layer 310*a* is formed on the seventh insulating layer 310*b* to cover the fifth redistribution wires 320, the sixth insulating layer 310*a* may be patterned to form sixth openings that expose the fifth redistribution wires 320. Redistribution pads 330 directly contacting the fifth redistribution wires 320 through the sixth openings may be formed on the sixth insulating layer 310*a*. The redistribution pads 330 may be formed on the peripheral region SR of the third redistribution layer 300. The peripheral region SR of the third redistribution layer 300 may surround the chip mounting region CR of the third redistribution layer 300, when viewed in plan view.

Referring to FIGS. 9 to 13, a second redistribution layer 200 having a logic semiconductor chip 500 may be formed on the third redistribution layer 300. The second redistribution layer 200 may be formed such that first chip pads 510 of the logic semiconductor chip 500 are electrically connected to second redistribution wires 230. The second redistribution layer 200 may have a third surface 202 and a fourth surface 204 opposite to each other.

Figure 9:
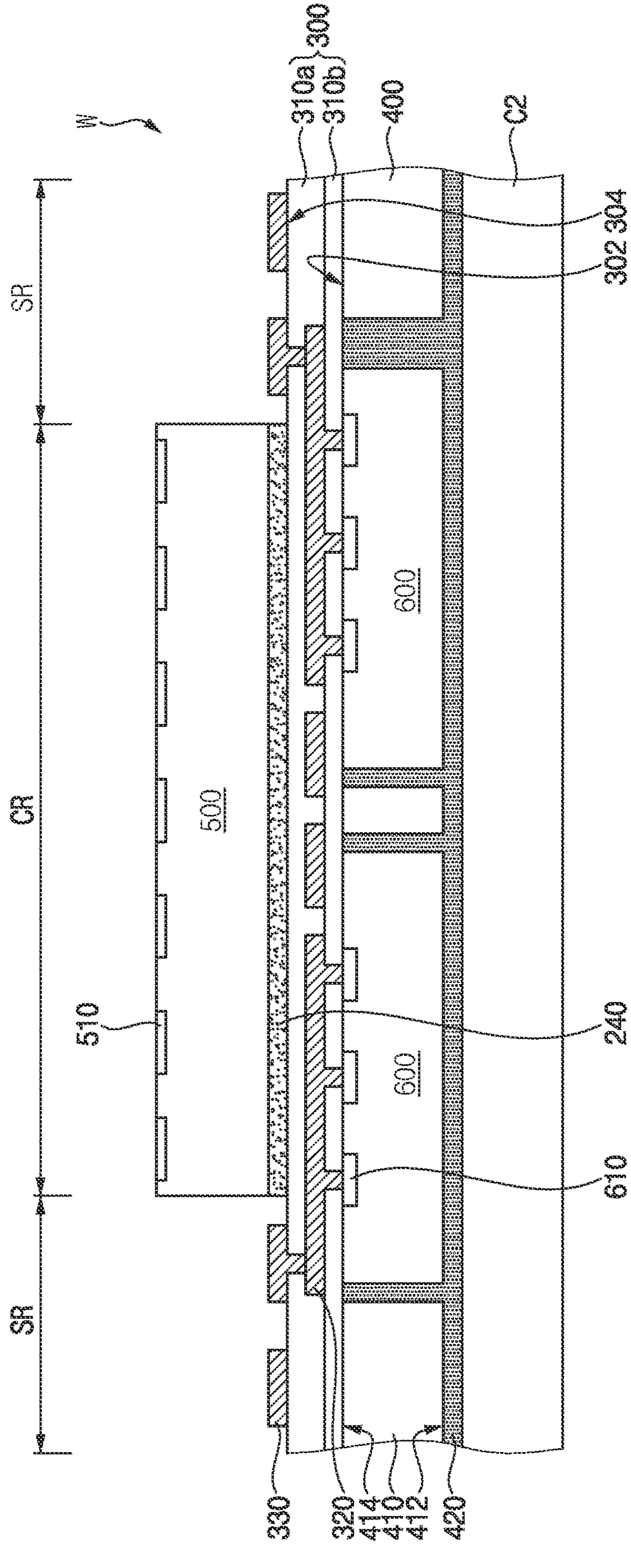

As illustrated in FIG. 9, first, the logic semiconductor chips 500 may be arranged on the third redistribution layer 300. The logic semiconductor chip 500 may be arranged on the chip mounting region CR of the third redistribution layer 300. The logic semiconductor chip 500 may be arranged such that a rear surface faces the third redistribution layer 300. The first chip pads 510 of the logic semiconductor chip 500 may be arranged to face an opposite direction of the third redistribution layer 300.

The rear surface of the logic semiconductor chip 500 may be attached to the third redistribution layer 300 through a chip mounting film 240. The chip mounting film 240 may be a die attach film (DAF). The chip mounting film 240 may fix the logic semiconductor chip 500 on the third redistribution layer 300 during a process.

Figure 10:
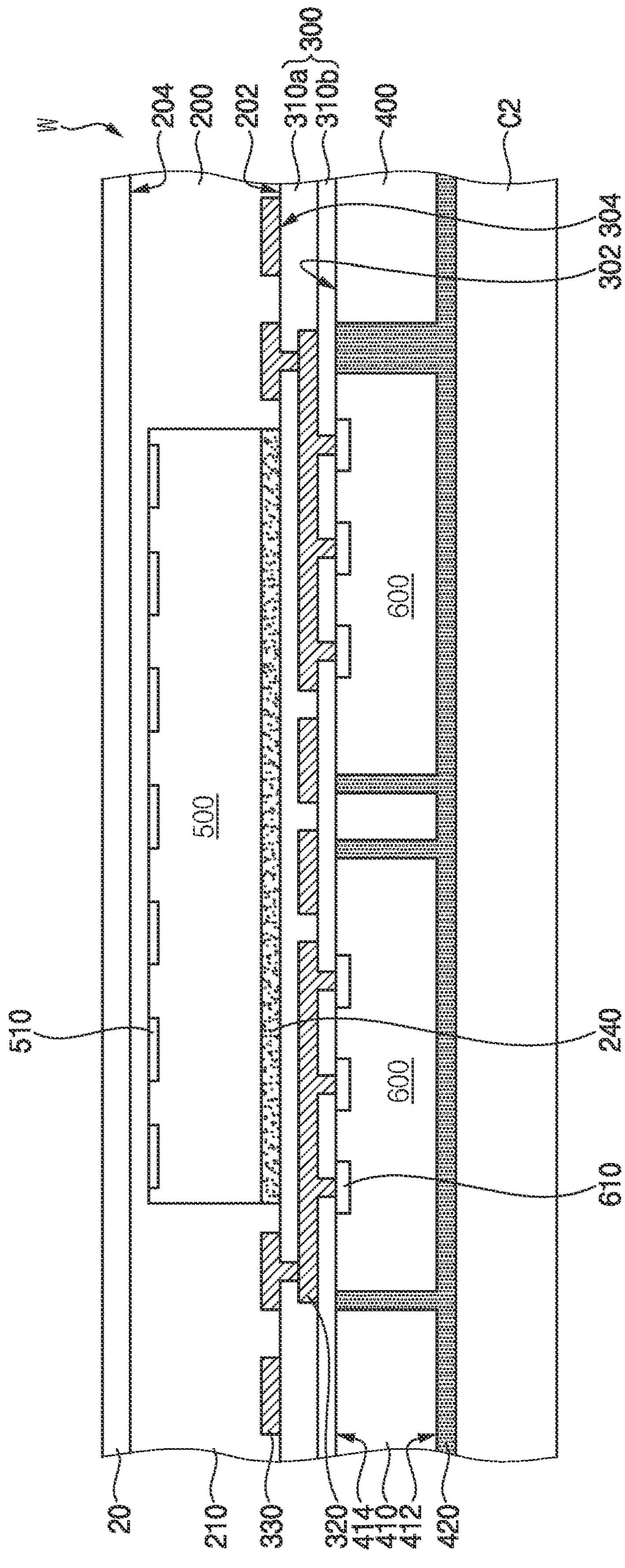

Then, as illustrated in FIG. 10, a fifth insulating layer 210 covering the logic semiconductor chip 500 on the third redistribution layer 300 and a second photoresist layer 20 provided on the fifth insulating layer 210 may be sequentially formed.

Figure 11:
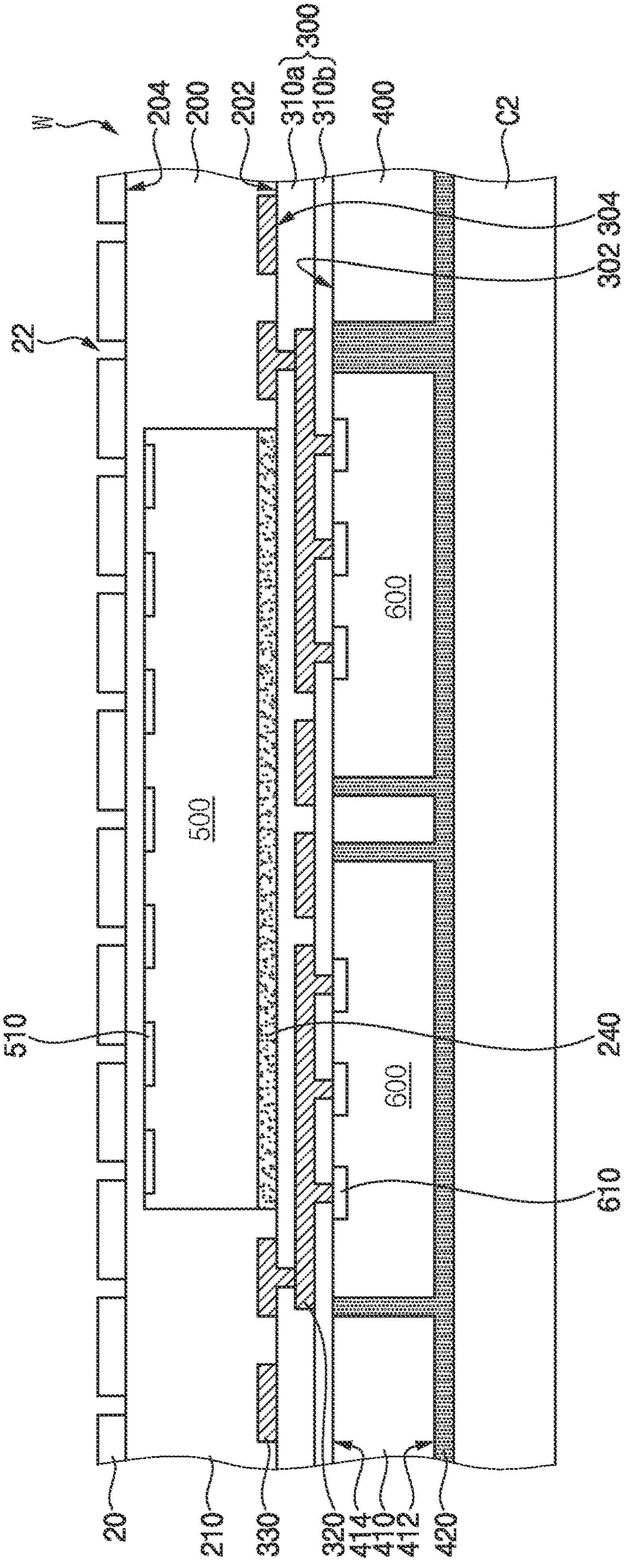

As illustrated in FIG. 11, an exposure process may be performed on the second photoresist layer 20 to form a second photoresist pattern 22 having temporary openings that expose regions of fourth redistribution wires 220 and the second redistribution wires 230.

Figure 12:
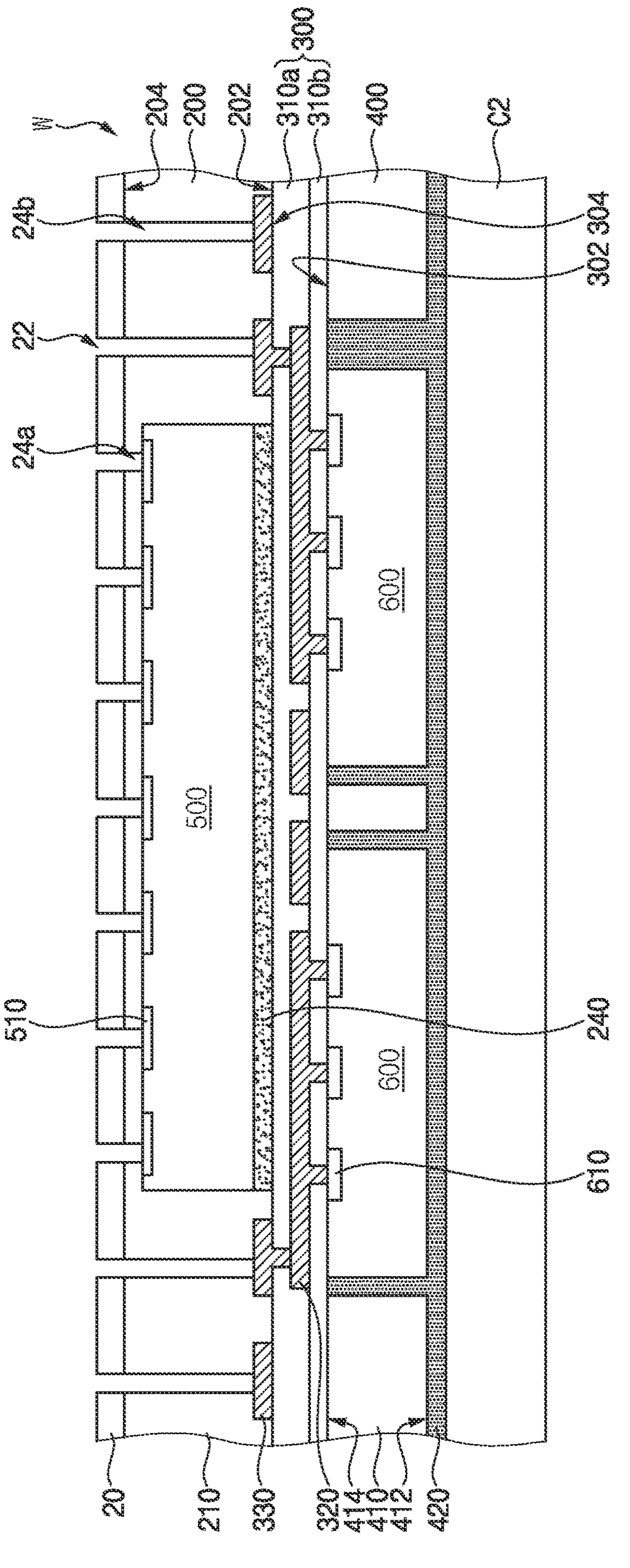

As illustrated in FIG. 12, an etching process may be performed on the second photoresist pattern 22 to form through openings 24*a* and 24*b*. The through openings 24*a* and 24*b* may be formed within the fifth insulating layer 210 by the etching process. At least some of the through openings 24*a* may expose the first chip pads 510 of the logic semiconductor chip 500. At least some other through openings 24*b* may expose the redistribution pads 330 of the third redistribution layer 300.

A portion of the fifth insulating layer 210 may be selectively removed to form the through openings 24*a* and 24*b*. For example, the etching process may include a wet etching process, a dry etching process, a plasma etching process, and the like.

Figure 13:
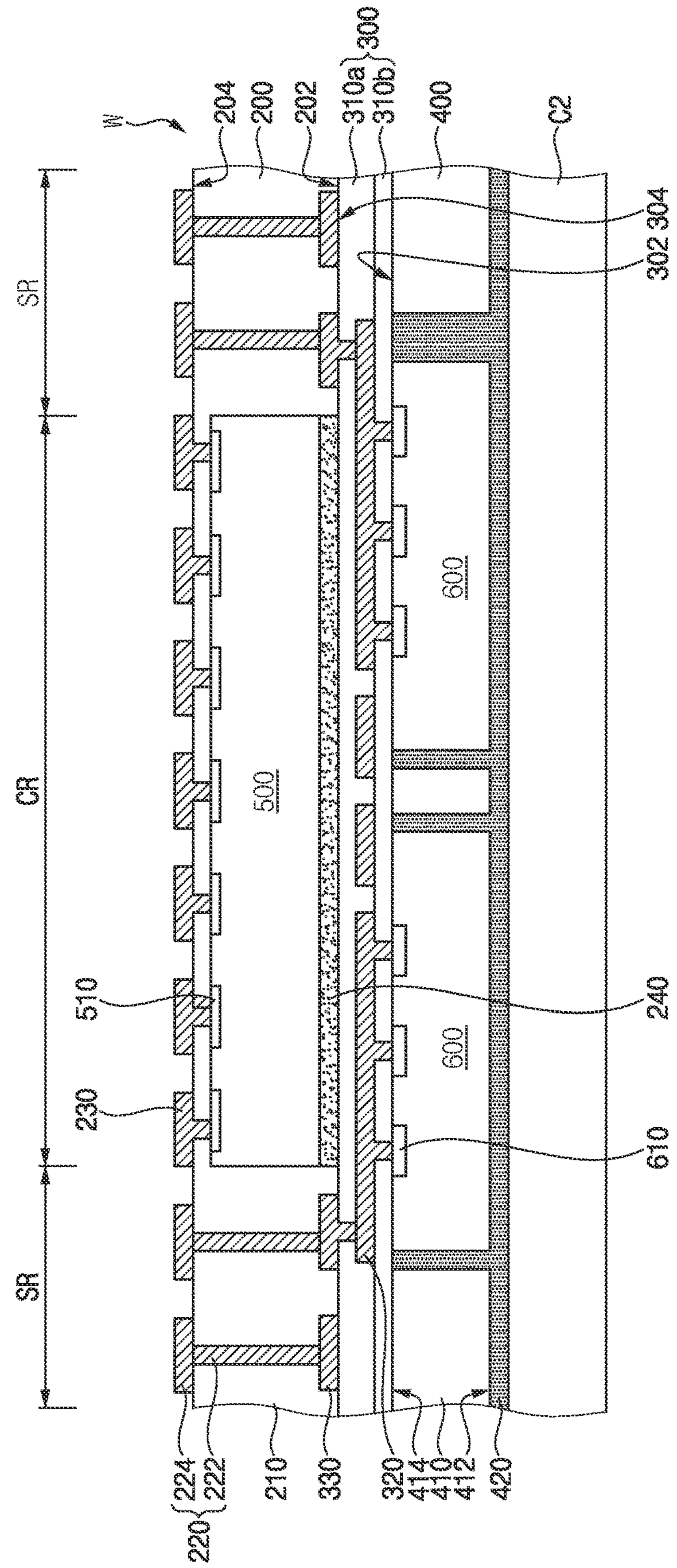

As illustrated in FIG. 13, the second redistribution wires 230 and the fourth redistribution wires 220 may be formed respectively within the through openings 24*a* and 24*b* of the fifth insulating layer 210.

First, a seed layer may be formed on the through openings 24*a* and 24*b*. The second redistribution wires 230 and the fourth redistribution wires 220 in the through openings 24*a* and 24*b* may be formed from the seed layer. For example, the seed layer may include titanium (Ti), titanium nitrogen compound (TiN), titanium oxygen compound ($TiO_2$), chromium nitrogen compound (CrN), titanium carbon nitrogen compound (TiCN), titanium aluminum nitrogen compound (TiAlN), or alloys thereof. The seed layer may be formed by a sputtering process.

The second redistribution wires 230 and the fourth redistribution wires 220 may be formed within the through openings 24*a* and 24*b* that penetrate the fifth insulating layer 210 in a vertical direction. A conductive material may be introduced into the through openings 24*a* and 24*b* to form the second redistribution wires 230 and the fourth redistribution wires 220. The conductive material may be hardened within the through openings 24*a* and 24*b* to form the second redistribution wires 230 and the fourth redistribution wires 220, respectively. The fourth redistribution wires 220 may be formed on the peripheral region SR. The second redistribution wires 230 may be formed on the chip mounting region CR.

A first plating process may be performed on the through openings 24*a* and 24*b* to form the second redistribution wires 230 and the fourth redistribution wires 220. For example, the fourth redistribution wires 220 and the second redistribution wires 230 may be formed by a plating process, an electroless plating process, a vapor deposition process, or the like. For example, the fourth redistribution wires 220 and the second redistribution wires 230 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

Then, the second photoresist layer 20 may be removed to form the fourth redistribution wires 220 and the second redistribution wires 230 that penetrate at least a portion of the fifth insulating layer 210 in the vertical direction. The fourth redistribution wires 220 may be electrically connected to the redistribution pads 330 of the third redistribution layer 300. The second redistribution wires 230 may be electrically connected to the first chip pads 510 of the logic semiconductor chip 500.

Figure 14:
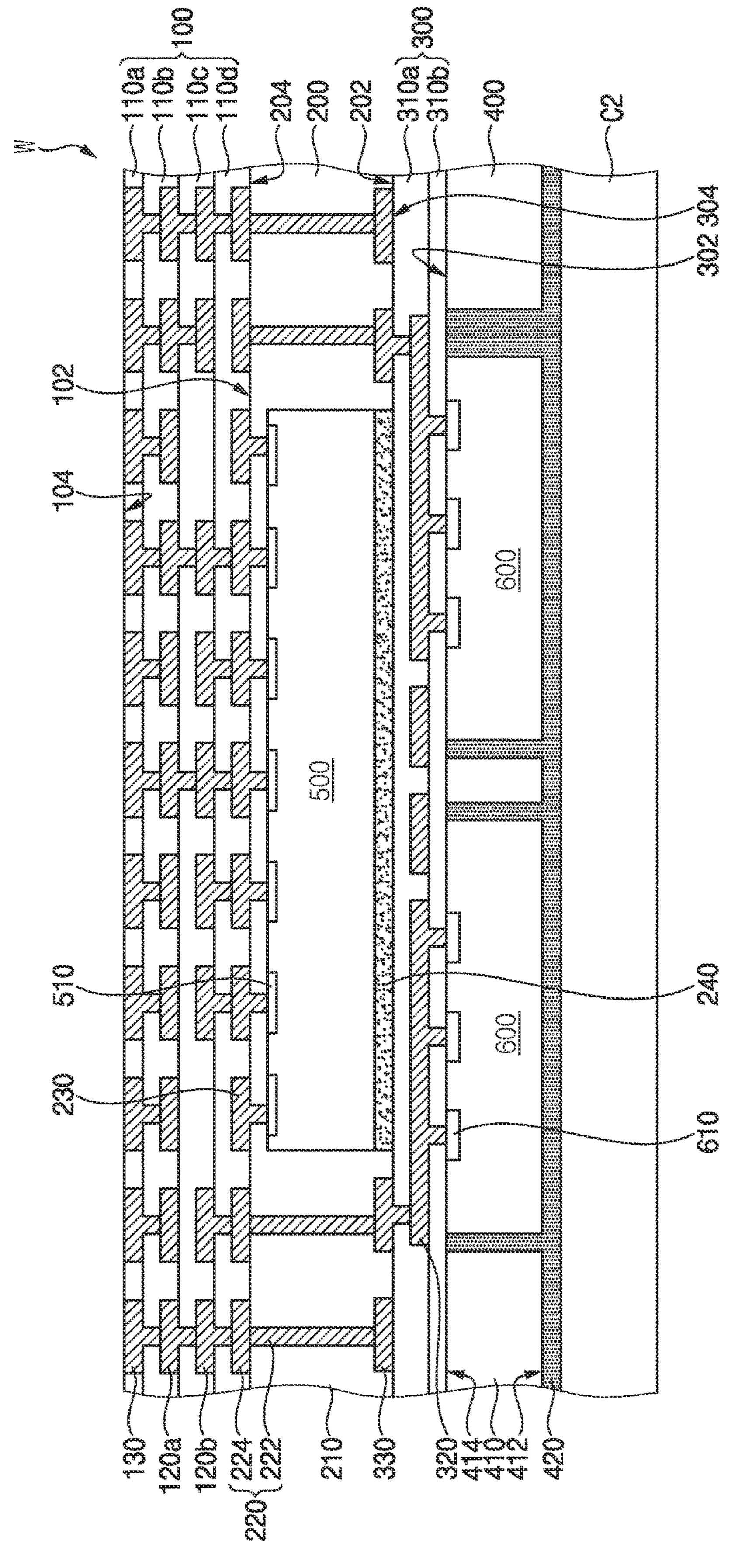

Referring to FIG. 14, processes the same as or similar to the processes described with reference to FIG. 8 may be performed on the second redistribution layer 200 to form the first redistribution layer 100.

First, after a fourth insulating layer **110*d* is formed on the second redistribution layer 200 to cover the fourth and second redistribution wires 220 and 230, the fourth insulating layer 110*d* may be patterned to form fourth openings that expose the fourth redistribution wires 220 and the second redistribution wires 230**.

Third redistributions wires **120*b* may be formed on the fourth insulating layer 110*d* to directly contact each of the fourth redistribution wires 220 and the second redistribution wires 230 through the fourth openings. After a seed layer is formed on a portion of the fourth insulating layer 110*d* and within the fourth opening, the seed layer may be patterned and an electrolytic plating process may be performed to form the third redistribution wires 120*b*. Thus, the third redistribution wires 120*b* may directly contact each of the fourth redistribution wires 220 and the second redistribution wires 230** through the fourth openings.

Then, after a third insulating layer **110*c* is formed on the fourth insulating layer 110*d* to cover the third redistribution wires 120*b*, the third insulating layer 110*c* may be patterned to form third openings that expose the third redistribution wires 120*b*. First, redistribution wires 120*a* directly contacting the third redistribution wires 120*b* through the third openings may be formed on the third insulating layer 110*c***.

Then, after a second insulating layer **110*b* is formed on the third insulating layer 110*c* to cover the first redistribution wires 120*a*, the second insulating layer 110*b* may be patterned to form second openings that expose the first redistribution wires 120*a*. Landing pads 130 directly contacting the first redistribution wires 120*a* through the second openings may be formed on the second insulating layer 110*b***.

Then, after a first insulating layer **110*a* is formed on the second insulating layer 110*b* to cover the landing pads 130, the first insulating layer 110*a* may be patterned to form first openings that expose the landing pads 130**.

Figure 15:
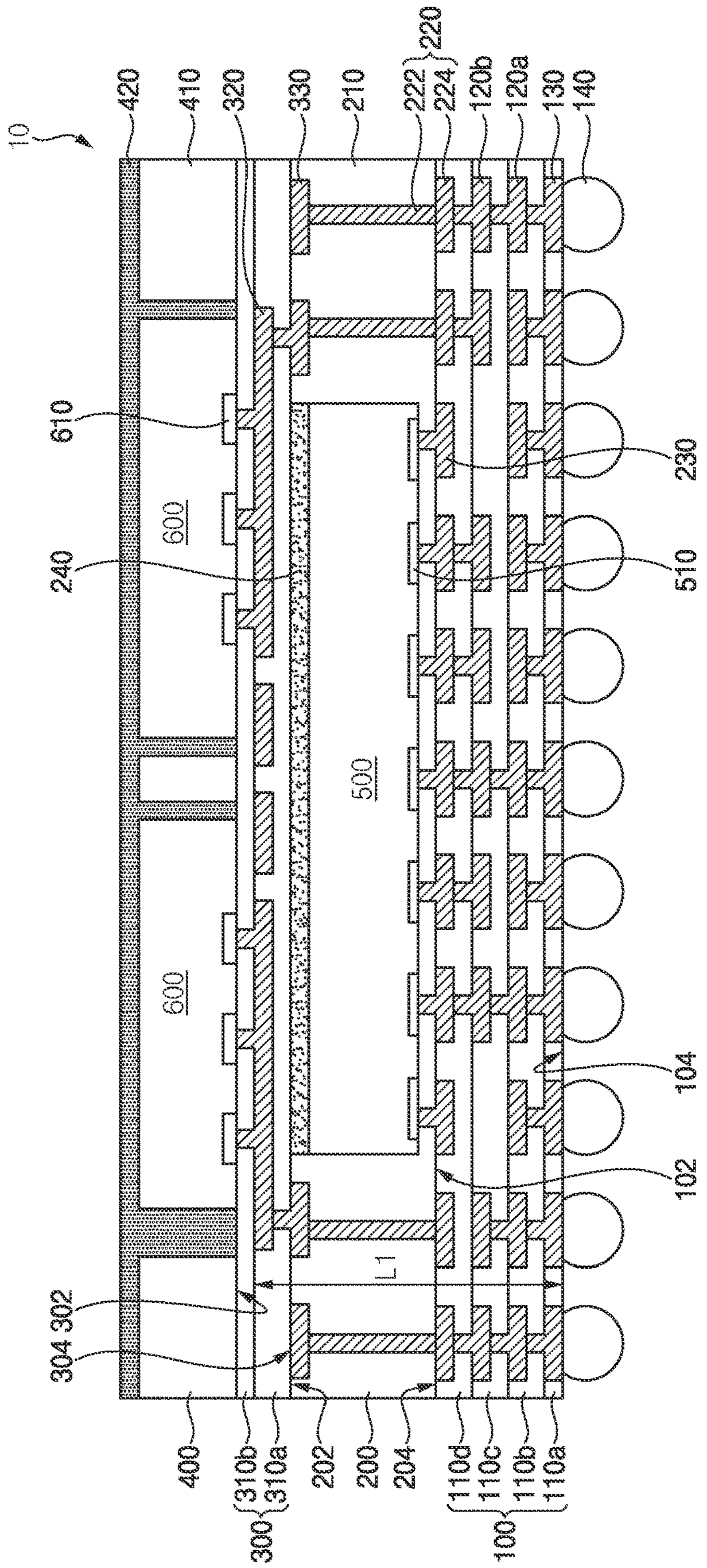

Referring to FIG. 15, external connection bumps 140 may be formed on the landing pads 130 of the first redistribution layer 100, respectively, and the semiconductor wafer W may be cut to complete the semiconductor package 10.

The external connection bumps 140 may be formed on the landing pads 130, respectively. Particularly, after third temporary openings of third photoresist pattern are filled up with conductive material, the third photoresist pattern may be removed and a reflow process may be performed to form the external connection bumps 140. For example, the conductive material may be formed by a plating process. Alternatively, the external connection bumps 140 may be formed by a screen printing method, a deposition method, or the like. For example, the external connection bumps 140 may include C4 bumps.

Then, the semiconductor wafer W may be cut along a scribe lane region to complete the semiconductor package 10 in FIG. 1. The semiconductor wafer W may be cut by a dicing process.

As described above, the memory semiconductor chip 600 may be electrically connected to the logic semiconductor chip 500 through the second and third redistribution wiring layers 200 and 300. Since no conductive bump is provided between the memory semiconductor chip 600 and the third redistribution wiring layer 300, a process may be simplified by excluding process steps that are performed to form the conductive bumps. Since conductive connection wiring (Au wiring), semiconductor substrate (PCB), etc. required to electrically connecting the memory semiconductor chip 600 and the logic semiconductor chip 500 are not used, process costs may be reduced. During the process, the number of times a carrier substrate is used may be reduced. An unnecessary process such as a laser ablation process may be excluded.

Also, since the conductive bumps are not provided, a thickness of the semiconductor package 10 may be reduced. When the thickness of the semiconductor package 10 is reduced, heat dissipation characteristics may be improved. Since a high-density circuit board (embedded trace substrate) for electrically connecting the conductive bumps is not used, a package structure may be simplified. Reliability of the semiconductor package 10 may be improved by reducing an intermetallic compound that is generated by the conductive bump.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface;

a second redistribution wiring layer disposed on the first surface of the first redistribution wiring layer, the second redistribution wiring layer including an insulating layer, a logic semiconductor chip provided in the insulating layer, second redistribution wires electrically connected to the logic semiconductor chip, and third redistribution wires electrically connected to the first redistribution wires, the third redistribution wires extending to penetrate the insulating layer;

a third redistribution wiring layer disposed on the second redistribution wiring layer, the third redistribution wiring layer including fourth redistribution wires electrically connected to the third redistribution wires; and a semiconductor substrate disposed on an upper surface of the third redistribution wiring layer, the semiconductor substrate including at least one memory semiconductor chip directly contacting the fourth redistribution wires.

2. The semiconductor package of claim 1, wherein the first redistribution wiring layer further includes a plurality of external connection bumps that are disposed on the landing pads, respectively.

3. The semiconductor package of claim 1, wherein each of the third redistribution wires includes a redistribution line electrically connected to a corresponding one of the first redistribution wires and a redistribution via provided on the redistribution line, and wherein the redistribution via penetrates at least a portion of the insulating layer to be electrically connected to the fourth redistribution wires.

4. The semiconductor package of claim 3, wherein the third redistribution wiring layer includes a chip mounting region in which the logic semiconductor chip is arranged, and a peripheral region surrounding the chip mounting region.

5. The semiconductor package of claim 4, wherein the redistribution vias of the third redistribution wires are provided in the peripheral region.

6. The semiconductor package of claim 1, wherein the second redistribution wiring layer further includes a chip mounting film that bonds the third redistribution wiring layer to an upper surface of the logic semiconductor chip.

7. The semiconductor package of claim 1, wherein the logic semiconductor chip further includes a plurality of first chip pads that are arranged to face the first surface of the first redistribution wiring layer, the plurality of first chip pads are electrically connected to the second redistribution wires, respectively.

8. The semiconductor package of claim 1, wherein the memory semiconductor chip further includes a plurality of second chip pads that directly contact at least some of the fourth redistribution wires.

9. The semiconductor package of claim 1, wherein the semiconductor substrate includes:

a silicon substrate having a cavity in which the memory semiconductor chip is accommodated; and a molding member filling a gap between an inner surface of the cavity and an outer surface of the memory semiconductor chip.

10. The semiconductor package of claim 1, wherein a distance from the second surface of the first redistribution wiring layer to the upper surface of the third redistribution wiring layer is within a range of 0.85 mm to 1 mm.

11. A method of manufacturing a semiconductor package, the method comprising:

forming at least one cavity vertically penetrating at least a portion of a semiconductor substrate, the semiconductor substrate having upper and lower surfaces opposite to each other;

arranging a memory semiconductor chip in the cavity such that second chip pads face the lower surface;

forming a third redistribution wiring layer on the lower surface of the semiconductor substrate, the third redistribution wiring layer having fourth redistribution wires that directly contact the second chip pads;

arranging a logic semiconductor chip on the third redistribution wiring layer such that a rear surface of the logic semiconductor chip faces the third redistribution wiring layer;

forming a second redistribution wiring layer on the third redistribution wiring layer, the second redistribution wiring layer having second redistribution wires and third redistribution wires, the third redistribution wires electrically connected to the fourth redistribution wires, the second redistribution wires electrically connected to first chip pads that are exposed from a front surface of the logic semiconductor chip; and forming a first redistribution wiring layer having first redistribution wires and landing pads on the second redistribution wiring layer, the first redistribution wires electrically connected to the second and third redistribution wires, the landing pads electrically connected to the first redistribution wires and exposed from a bottom surface of the first redistribution wiring layer.

12. The method of claim 11, wherein the arranging the memory semiconductor chip into the cavity further includes filling a gap between an inner surface of the cavity and an outer surface of the memory semiconductor chip with a molding member.

13. The method of claim 11, wherein the forming the second redistribution wiring layer on the third redistribution wiring layer further includes:

forming an insulating layer on the third redistribution wiring layer to cover the logic semiconductor chip;

forming through openings in the insulating layer, the through openings exposing the first chip pads and the fourth redistribution wires; and forming the second redistribution wires and the third redistribution wires in the through openings.

14. The method of claim 13, wherein the forming the second redistribution wiring layer on the third redistribution wiring layer further includes:

forming redistribution vias in the through openings; and stacking redistribution wires on the redistribution vias.

15. The method of claim 11, wherein the third redistribution wiring layer includes a chip mounting region in which the logic semiconductor chip is arranged, and a peripheral region surrounding the chip mounting region, and wherein the forming the third redistribution wiring layer further includes forming the fourth redistribution wires to be exposed from the peripheral region.

16. The method of claim 15, wherein the arranging the logic semiconductor chip further includes arranging the logic semiconductor chip on the chip mounting region.

17. The method of claim 11, wherein the arranging the logic semiconductor chip further includes adhering the rear surface of the logic semiconductor chip on the third redistribution wiring layer through a chip mounting film.

18. The method of claim 11, wherein the forming the first redistribution wiring layer further includes forming a plurality of external connection bumps on the landing pads, respectively.

19. The method of claim 11, wherein each of the first to fourth redistribution wires include at least one of copper (Cu), aluminum (Al), tungsten (W), nickel (Ni), molybdenum (Mo), gold (Au), silver (Ag), chromium (Cr), Tin (Sn) and Titanium (Ti).

20. A semiconductor package, comprising:

a first redistribution wiring layer having first and second surfaces opposite to each other, the first redistribution wiring layer including a plurality of first redistribution wires and a plurality of landing pads electrically connected to the first redistribution wires, the plurality of landing pads exposed from the second surface;

a second redistribution wiring layer disposed on the first surface of the first redistribution wiring layer; the second redistribution wiring layer including an insulating layer, a logic semiconductor chip provided in the insulating layer, second redistribution wires electrically connected to the logic semiconductor chip and the first redistribution wires, and third redistribution wires electrically connected to the first redistribution wires and extending to penetrate the insulating layer;

a third redistribution wiring layer disposed on the second redistribution wiring layer, the third redistribution wiring layer having fourth redistribution wires that are electrically connected to the third redistribution wires;

a chip mounting film adhering the third redistribution wiring layer and an upper surface of the logic semiconductor chip; and a semiconductor substrate disposed on an upper surface of the third redistribution wiring layer, the semiconductor substrate including at least one memory semiconductor chip directly contacting the fourth redistribution wires, a cavity in which the memory semiconductor chip is accommodated therein, and a molding member provided between the cavity and the memory semiconductor chip.

* * * * *